US009143110B2

(12) United States Patent
Sano et al.

(10) Patent No.: US 9,143,110 B2
(45) Date of Patent: Sep. 22, 2015

(54) AUTOMATIC GAIN CONTROL CIRCUIT

(75) Inventors: Kimikazu Sano, Tokyo (JP); Hiroyuki Fukuyama, Tokyo (JP); Makoto Nakamura, Tokyo (JP); Hideyuki Nosaka, Tokyo (JP); Miwa Mutoh, Tokyo (JP); Koichi Murata, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 32 days.

(21) Appl. No.: 14/114,519

(22) PCT Filed: Jun. 29, 2012

(86) PCT No.: PCT/JP2012/066766
§ 371 (c)(1),
(2), (4) Date: Oct. 28, 2013

(87) PCT Pub. No.: WO2013/002388
PCT Pub. Date: Jan. 3, 2013

(65) Prior Publication Data
US 2014/0097901 A1    Apr. 10, 2014

(30) Foreign Application Priority Data

Jun. 30, 2011 (JP) ................................ 2011-145409

(51) Int. Cl.
*H03G 3/10*    (2006.01)
*H03F 1/08*    (2006.01)
*H03G 3/30*    (2006.01)

(52) U.S. Cl.
CPC ............... *H03G 3/30* (2013.01); *H03G 3/3084* (2013.01)

(58) Field of Classification Search
USPC .......................... 330/279, 278, 293, 285, 296
IPC ...................................... H03G 3/10; H03F 1/08
See application file for complete search history.

(56) References Cited

U.S. PATENT DOCUMENTS 6,160,449 A *  12/2000  Klomsdorf et al. ........... 330/149
6,995,806 B1 *  2/2006  Al-Araji et al. ............... 348/725
(Continued)

FOREIGN PATENT DOCUMENTS

CN    102843111 A    12/2012
JP    S57-087223 A    5/1982
(Continued)

OTHER PUBLICATIONS

Gray et al., "Analysis and Design of Analog Integrated Circuits", fourth edition, Baifukan, pp. 262-267, 2003.
Sano et al., "A Wideband Low-distorted ROSA for Video Distribution Service based on FM Conversion Scheme", ECOC 2007 Proceedings, vol. 3, pp. 167-168, 2007.

*Primary Examiner* — Patricia T Nguyen
(74) *Attorney, Agent, or Firm* — Blakely Sokoloff Taylor & Zafman

(57) ABSTRACT

An automatic gain control circuit (5a) includes a peak detector circuit (10) that detects the peak voltage of the output signal from a variable gain amplifier (3), an average value detection and output amplitude setting circuit (11) that detects the average voltage of the output signals from the variable gain amplifier (3) and adds a voltage ½ the desired output amplitude of the variable gain amplifier (3) to the average voltage, and a high gain amplifier (12) that amplifies the difference between the output voltage of the peak detector circuit (10) and the output voltage of the average value detection and output amplitude setting circuit (11) and controls the gain of the variable gain amplifier (3) using the amplification result as a gain control signal. The peak detector circuit (10) includes transistors (Q1, Q2, Q3), a current source (I1), and a filter circuit. The filter circuit includes a series connection of a resistor (Ra) and a capacitor (C1).

3 Claims, 10 Drawing Sheets

(56) References Cited

U.S. PATENT DOCUMENTS

| | | | |
|---|---|---|---|
| 8,072,205 B1* | 12/2011 | Deo et al. | 324/76.13 |
| 8,190,107 B1* | 5/2012 | Gilbert | 455/115.1 |
| 2002/0008580 A1* | 1/2002 | Ohashi et al. | 330/254 |
| 2002/0125945 A1* | 9/2002 | Taylor | 330/129 |
| 2008/0002787 A1* | 1/2008 | Zipper et al. | 375/297 |
| 2010/0237943 A1 | 9/2010 | Kim et al. | |
| 2012/0326782 A1 | 12/2012 | Sano et al. | |

FOREIGN PATENT DOCUMENTS

| | | |
|---|---|---|
| JP | H02-183680 A | 7/1990 |
| JP | 08-223228 | 8/1996 |
| JP | 11-27216 | 1/1999 |
| JP | 2008-003006 A | 1/2008 |
| JP | 2009-260715 | 11/2009 |

* cited by examiner

AUTOMATIC GAIN CONTROL CIRCUIT

TECHNICAL FIELD

The present invention relates to an automatic gain control circuit that automatically controls the gain of a variable gain amplifier in a semiconductor integrated circuit.

BACKGROUND ART

Conventionally, an automatic gain control (AGC) circuit is used as a constituent element of a transimpedance amplifier circuit that converts a small photocurrent into a voltage signal and simultaneously amplifies it. FIG. 12 shows the arrangement of a transimpedance amplifier circuit disclosed in literature "Kimikazu Sano, et al., "A Wideband Low-distorted ROSA for Video Distribution Service based on FM Conversion Scheme", ECOC 2007 Proceedings, Vol. 3, pp. 167-168, 2007".

A transimpedance core circuit 1 converts a current signal obtained by a light-receiving element such as a photodiode (not shown) into a voltage signal. An offset compensator circuit 2 compensates for the offset from the output signal of the transimpedance core circuit 1. A variable gain amplifier 3 amplifies the output signal from the transimpedance core circuit 1. The output signal from the variable gain amplifier 3 is output to differential output terminals OT and OC via an output buffer 4. An automatic gain control circuit 5 generates a gain control signal and controls the gain of the variable gain amplifier 3 such that the amplitude of the output signal of the variable gain amplifier 3 matches a predetermined set output amplitude.

The automatic gain control circuit 5 will be described below in detail. The automatic gain control circuit 5 includes a peak detector circuit 50, an average value detector circuit 51, an output amplitude setting circuit 52, an operational amplifier 53, resistors r51, r52, r53, and r54, and capacitors c51, c52, and c53. The peak detector circuit 50 detects a peak value THo of the output signal from the variable gain amplifier 3. The average value detector circuit 51 detects an average value Ave of the output signals from the variable gain amplifier 3. The difference between the peak value THo and the average value Ave corresponds to the half (half amplitude) of the amplitude of the output signal from the variable gain amplifier 3. A set output half amplitude Aset to be used as a reference is set in the output amplitude setting circuit 52 in advance. The output amplitude setting circuit 52 outputs the set output half amplitude Aset to the noninverting input terminal and the inverting input terminal of the operational amplifier 53.

At the input of the operational amplifier 53, the output amplitude of the variable gain amplifier 3 and the set output half amplitude Aset output from the output amplitude setting circuit 52 are added as indicated by $$Ave-THo+A\text{Set} \tag{1}$$

At the time of stable operation, the input to the operational amplifier 53 is almost 0 because of the high gain properties of the operational amplifier itself. For this reason, the value of expression (1) is almost 0, that is, $$THo-Ave \approx A\text{Set} \tag{2}$$

holds.

That is, the operational amplifier 53 amplifies the difference between the set output half amplitude Aset and the output half amplitude (THo−Ave) of the variable gain amplifier 3, and outputs the gain control signal to the variable gain amplifier 3 based on the amplification result. The operational amplifier 53 thus controls the gain of the variable gain amplifier 3 such that the output half amplitude (THo−Ave) of the variable gain amplifier 3 stabilizes in the set output half amplitude Aset.

As the variable gain amplifier 3, for example, a Gilbert cell type variable gain amplifier is used. FIG. 13 shows the arrangement of a Gilbert cell type variable gain amplifier disclosed in literature "P. R. Gray, P. J. Hurst, S. H. Lewis, and R. G. Meyer (authors); Kunihiro Asada and Minoru Nagata (supervisors of translation), "Analysis and Design of Analog Integrated Circuits", fourth edition, Baifukan, pp. 263-264, 2003". This variable gain amplifier includes amplitude adjustment transistors Q30 and Q31 forming an upper differential pair for adjusting the output amplitude in accordance with gain control signals GCT and GCC input to the bases, amplitude adjustment transistors Q32 and Q33 forming another upper differential pair, amplification transistors Q34 and Q35 having bases connected to a positive-phase input terminal HIT and a negative-phase input terminal HIC, respectively, and forming a lower differential pair, a current source I30 having one terminal connected to the emitters of the amplification transistors Q34 and Q35 and the other terminal receiving a power supply voltage VEE, a collector resistor R30 having one terminal receiving a power supply voltage VCC and the other terminal connected to the collectors of the amplitude adjustment transistors Q30 and Q32, and a collector resistor R31 having one terminal receiving the power supply voltage VCC and the other terminal connected to the collectors of the amplitude adjustment transistors Q31 and Q33. The collector of the amplification transistor Q34 is connected to the emitters of the amplitude adjustment transistors Q30 and Q31. The collector of the amplification transistor Q35 is connected to the emitters of the amplitude adjustment transistors Q32 and Q33.

In the variable gain amplifier shown in FIG. 13, the positive-phase input signal and the negative-phase input signal output from the transimpedance core circuit 1 are input to the positive-phase input terminal HIT and the negative-phase input terminal HIC, respectively. The gain control signals GCT and GCC are input to the amplitude adjustment transistors Q30 and Q31 forming an upper differential pair, respectively. The gain control signals GCT and GCC are also input to the amplitude adjustment transistors Q33 and Q32 forming another upper differential pair, respectively. The node between the collector resistor R31 and the collectors of the amplitude adjustment transistors Q31 and Q33 is connected to a positive-phase output terminal HOT. The node between the collector resistor R30 and the collectors of the amplitude adjustment transistors Q30 and Q32 is connected to a negative-phase output terminal HOC.

DISCLOSURE OF INVENTION

Problem to be Solved by the Invention

In the transimpedance amplifier circuit shown in FIG. 12, when the input amplitude to the variable gain amplifier 3 varies, the gain and output amplitude of the variable gain amplifier 3 automatically vary in accordance with the variation, and the amplitude eventually converges to the output amplitude set in the automatic gain control circuit 5. The gain and output amplitude sometimes vary unstably during the variation in the gain and output amplitude of the variable gain amplifier 3 according to the variation in the input amplitude.

The gain and output amplitude of the variable gain amplifier 3 unstably vary because the phase margin of the AGC loop that is a negative feedback loop formed from the variable gain amplifier 3 and the automatic gain control circuit 5 is insufficient.

The present invention has been made to solve the above-described problem and has as its object to make the output amplitude of a variable gain amplifier stably vary when the input amplitude to the variable gain amplifier varies.

Means of Solution to the Problem

An automatic gain control circuit according to the present invention is an automatic gain control circuit that controls a gain of a variable gain amplifier that amplifies a main signal, comprising a peak detector circuit that detects a peak voltage of an output signal from the variable gain amplifier, an average value detection and output amplitude setting circuit that detects an average voltage of the output signals from the variable gain amplifier and adds a voltage ½ a desired output amplitude of the variable gain amplifier to the average voltage, and an amplifier circuit that amplifies a difference between an output voltage of the peak detector circuit and an output voltage of the average value detection and output amplitude setting circuit and controls the gain of the variable gain amplifier using an amplification result as a gain control signal, the peak detector circuit comprising a first transistor having a base connected to a positive-phase input terminal of the automatic gain control circuit and a collector receiving a power supply voltage, a second transistor having a base connected to a negative-phase input terminal of the automatic gain control circuit and a collector receiving the power supply voltage, and a first emitter follower circuit having an input connected to emitters of the first transistor and the second transistor and an output connected to an output terminal of the peak detector circuit.

Effect of the Invention

According to the present invention, the phase variation amount with respect to the frequency change in the peak detector circuit can be decreased. The phase variation amount with respect to the frequency change of the AGC loop formed from the variable gain amplifier and the automatic gain control circuit can also be decreased. Hence, a large phase margin can be ensured for the AGC loop, and stabilization of the AGC loop can be implemented. In the present invention, it is consequently possible to make the output amplitude of the variable gain amplifier stably vary when the input amplitude of the variable gain amplifier varies. In the present invention, stabilization of the output amplitude of the variable gain amplifier can be implemented almost without the circuit cost. In the present invention, it is also possible to shorten the response time until the output amplitude of the variable gain amplifier reaches the set amplitude. Furthermore, in the present invention, since the average value detector circuit and the output amplitude setting circuit are integrated, it is possible to obtain the effects of decreasing the number of use elements, reducing the chip area, and reducing the power consumption.

BEST MODE FOR CARRYING OUT THE INVENTION

First Embodiment

Figure 1:
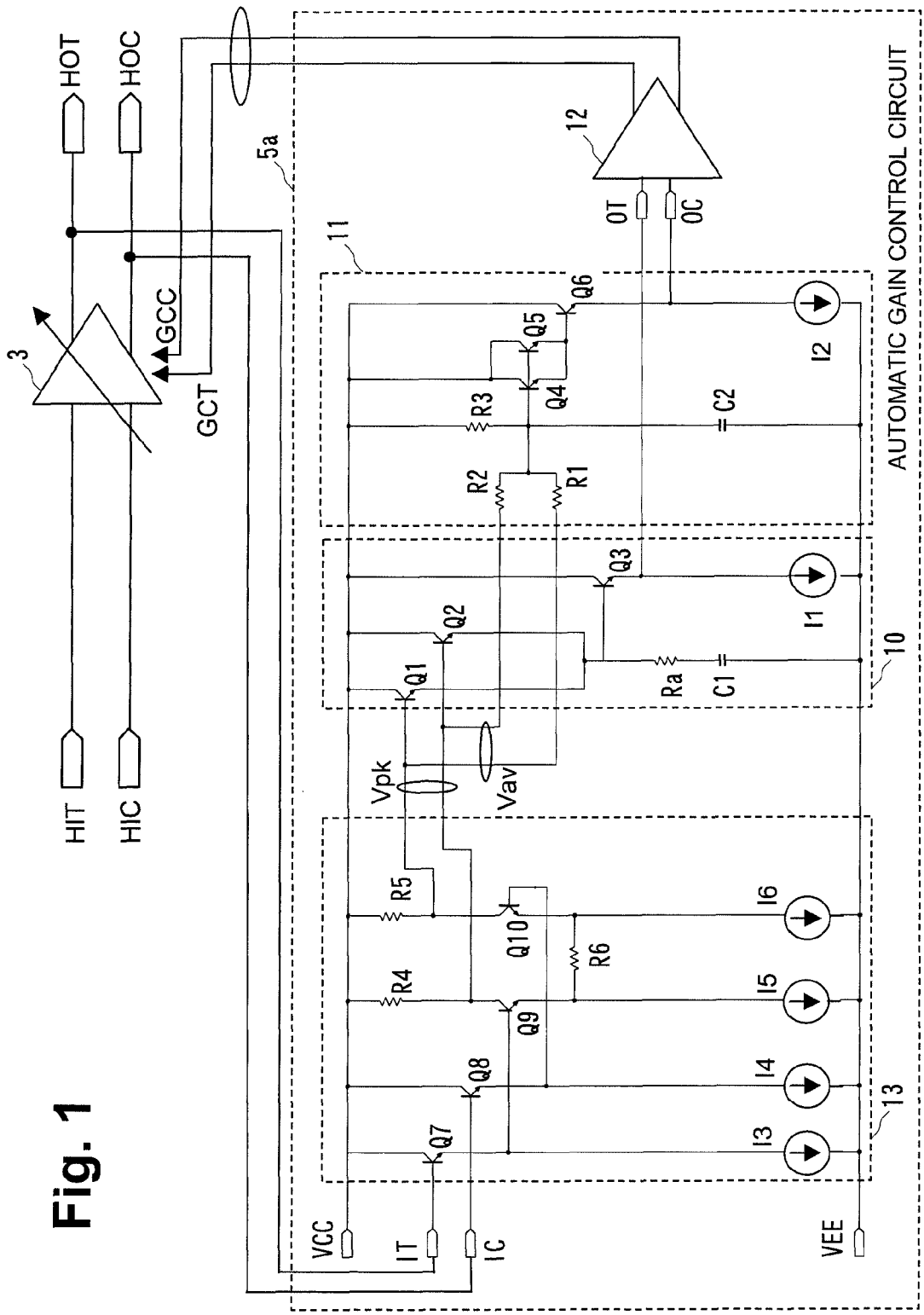
FIG. 1 is a circuit diagram showing the arrangement of an automatic gain control circuit according to the first embodiment of the present invention.

An embodiment of the present invention will now be described with reference to the accompanying drawings. FIG. 1 is a circuit diagram showing the arrangement of an automatic gain control circuit according to the first embodiment of the present invention.

Figure 12:
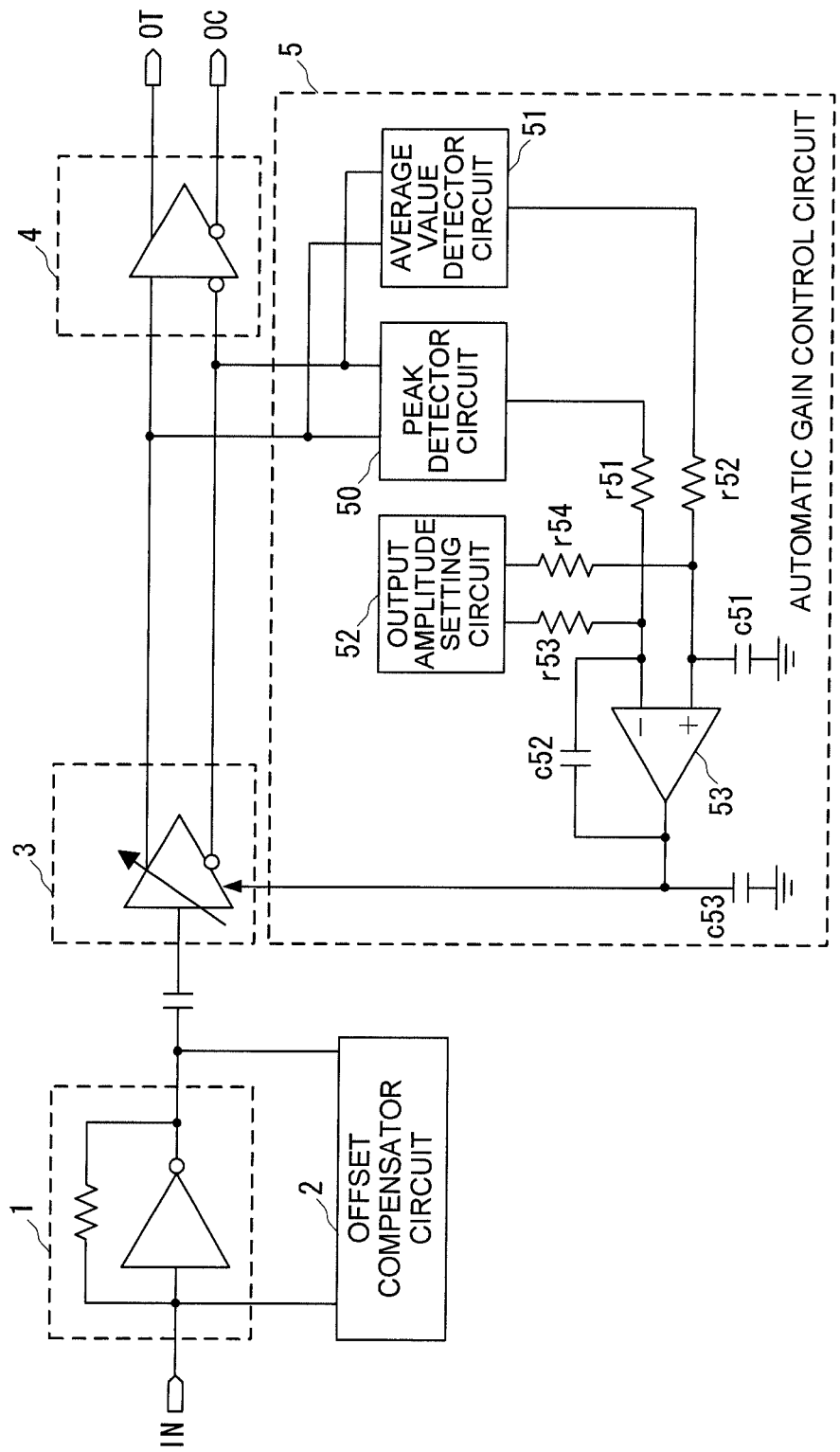
FIG. 12 is a block diagram showing the arrangement of a conventional transimpedance amplifier circuit.

An automatic gain control circuit 5a according to this embodiment generates and outputs a gain control signal to a variable gain amplifier 3 while monitoring the output amplitude of the variable gain amplifier 3 such that the output amplitude becomes equal to the amplitude set in the automatic gain control circuit 5a, like the conventional automatic gain control circuit 5 shown in FIG. 12.

The automatic gain control circuit 5a according to this embodiment includes a peak detector circuit 10, an average value detection and output amplitude setting circuit 11, a high gain amplifier 12 that is a differential amplifier circuit, and a buffer circuit 13.

The peak detector circuit 10 is a circuit that detects the peak voltage of the output signal from the variable gain amplifier 3, like the conventional peak detector circuit 50 shown in FIG. 12. The peak detector circuit 10 includes a transistor Q1 having a base connected to the positive-phase output terminal of the buffer circuit 13 and a collector receiving a power supply voltage VCC, a transistor Q2 having a base connected to the negative-phase output terminal of the buffer circuit 13 and a collector receiving the power supply voltage VCC, a transistor Q3 having a base connected to the emitters of the transistors Q1 and Q2 and a collector receiving the power supply voltage VCC, a resistor Ra having one terminal connected to the emitters of the transistors Q1 and Q2 and the base of the transistor Q3, a capacitor C1 having one terminal connected to the other terminal of the resistor Ra and the other terminal receiving a power supply voltage VEE, and a current source I1 having one terminal connected to the emitter of the transistor Q3 and the other terminal receiving the power supply voltage VEE. The transistor Q3 and the current source I1 form an emitter follower circuit.

The average value detection and output amplitude setting circuit 11 is a circuit that integrates an average value detector circuit and an output amplitude setting circuit, which are separated in the conventional automatic gain control circuit 5 shown in FIG. 12. The average value detection and output amplitude setting circuit 11 detects the average voltage of the output signals of the variable gain amplifier 3, and simultaneously adds a voltage (half amplitude) about ½ the desired output amplitude of the variable gain amplifier 3 to the average voltage. The average value detection and output amplitude setting circuit 11 includes transistors Q4 and Q5 each having a collector receiving the power supply voltage VCC, a transistor Q6 having a base connected to the emitters of the transistors Q4 and Q5 and a collector receiving the power supply voltage VCC, a resistor R1 having one terminal connected to the positive-phase output terminal of the buffer circuit 13 and the other terminal connected to the bases of the transistors Q4 and Q5, a resistor R2 having one terminal connected to the negative-phase output terminal of the buffer circuit 13 and the other terminal connected to the bases of the transistors Q4 and Q5, a resistor R3 having one terminal receiving the power supply voltage VCC and the other terminal connected to the bases of the transistors Q4 and Q5, a capacitor C2 having one terminal connected to the bases of the transistors Q4 and Q5 and the other terminal receiving the power supply voltage VEE, and a current source I2 having one terminal connected to the emitter of the transistor Q6 and the other terminal receiving the power supply voltage VEE. The transistor Q6 and the current source I2 form an emitter follower circuit.

The output terminal of the peak detector circuit 10 (the node between the current source I1 and the emitter of the transistor Q3) is connected to a positive-phase input terminal OT of the high gain amplifier 12. The output terminal of the average value detection and output amplitude setting circuit 11 (the node between the current source I2 and the emitter of the transistor Q6) is connected to a negative-phase input terminal OC of the high gain amplifier 12.

The high gain amplifier 12 has the same function as the conventional operational amplifier 53 shown in FIG. 12. That is, the high gain amplifier 12 amplifies the difference between the output voltage of the peak detector circuit 10 and the output voltage of the average value detection and output amplitude setting circuit 11, and outputs the amplification result to the variable gain amplifier 3 as the gain control signal. The high gain amplifier 12 thus controls the gain of the variable gain amplifier 3 such that the output voltage of the peak detector circuit 10 equals the output voltage of the average value detection and output amplitude setting circuit 11.

Figure 13:
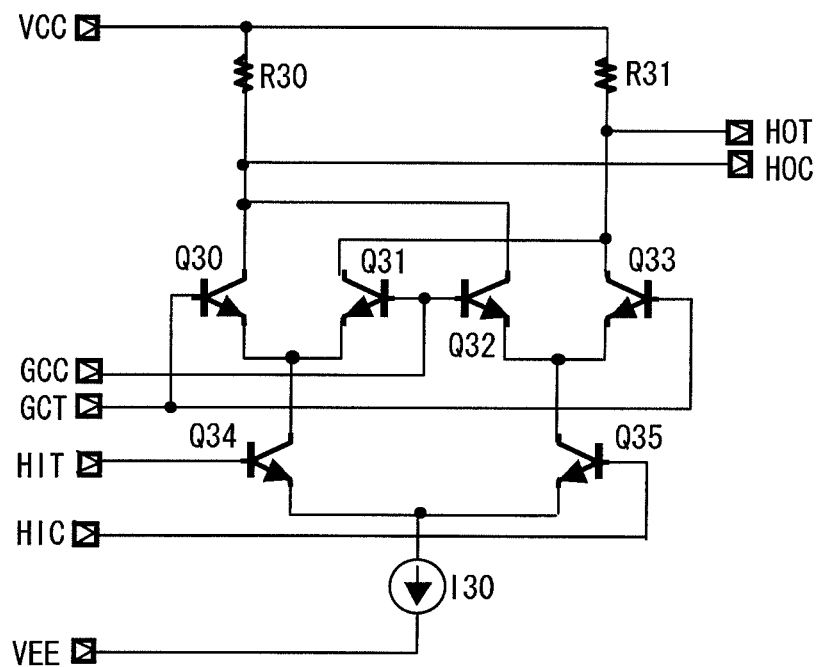
FIG. 13 is a circuit diagram showing the arrangement of a Gilbert cell type variable gain amplifier.

As described above, as the variable gain amplifier 3, for example, the Gilbert cell type variable gain amplifier shown in FIG. 13 is used. A positive-phase output terminal HOT of the variable gain amplifier 3 is connected to a positive-phase input terminal IT of the automatic gain control circuit 5a. A negative-phase output terminal HOC of the variable gain amplifier 3 is connected to a negative-phase input terminal IC of the automatic gain control circuit 5a. A positive-phase-side gain control signal GCT and a negative-phase-side gain control signal GCC output from the high gain amplifier 12 are input to the variable gain amplifier 3.

On the other hand, the buffer circuit 13 is provided between the peak detector circuit 10 and the positive-phase input terminal IT and the negative-phase input terminal IC of the automatic gain control circuit 5a. The buffer circuit 13 includes a transistor Q7 having a base connected to the positive-phase input terminal IT of the automatic gain control circuit 5a and a collector receiving the power supply voltage VCC, a transistor Q8 having a base connected to the negative-phase input terminal IC of the automatic gain control circuit 5a and a collector receiving the power supply voltage VCC, transistors Q9 and Q10 having a differential arrangement with bases connected to the emitters of the transistors Q7 and Q8, respectively, a resistor R4 having one terminal receiving the power supply voltage VCC and the other terminal connected to the collector of the transistor Q9, a resistor R5 having one terminal receiving the power supply voltage VCC and the other terminal connected to the collector of the transistor Q10, a resistor R6 having one terminal connected to the emitter of the transistor Q9 and the other terminal connected to the emitter of the transistor Q10, a current source I3 having one terminal connected to the emitter of the transistor Q7 and the other terminal receiving the power supply voltage VEE, a current source I4 having one terminal connected to the emitter of the transistor Q8 and the other terminal receiving the power supply voltage VEE, a current source I5 having one terminal connected to the emitter of the transistor Q9 and the other terminal receiving the power supply voltage VEE, and a current source I6 having one terminal connected to the emitter of the transistor Q10 and the other terminal receiving the power supply voltage VEE.

The transistor Q7 and the current source I3 form an emitter follower circuit. Similarly, the transistor Q8 and the current source I4 form an emitter follower circuit. The transistors Q9 and Q10, the resistors R4, R5, and R6, and the current sources I5 and I6 form an output circuit (differential amplifier circuit).

The positive-phase output terminal of the buffer circuit 13 (the node between the resistor R5 and the collector of the transistor Q10) is connected to the positive-phase input terminal of the peak detector circuit 10 (the base of the transistor Q1) and the positive-phase input terminal of the average value detection and output amplitude setting circuit 11 (one terminal of the resistor R1). The negative-phase output terminal of the buffer circuit 13 (the node between the resistor R4 and the collector of the transistor Q9) is connected to the negative-phase input terminal of the peak detector circuit 10 (the base of the transistor Q2) and the negative-phase input terminal of the average value detection and output amplitude setting circuit 11 (one terminal of the resistor R2).

The role of the buffer circuit 13 is to reduce the magnitude of a load, in particular, a capacitive load on the differential output terminals HOT and HOC of the variable gain amplifier 3 and ensure a large band on the high frequency side of the variable gain amplifier 3. How to implement this role can be explained as follows. When the input of the peak detector circuit 10, the input of the average value detection and output amplitude setting circuit 11, and the output of the variable gain amplifier 3 are directly connected, the load on the differential output terminals HOT and HOC of the variable gain amplifier 3 includes two circuits, that is, the peak detector circuit 10 and the average value detection and output amplitude setting circuit 11. Since the load includes two circuits, the load driven by the variable gain amplifier 3 is formed by two transistors per output terminal even when transistors of a minimum size permitted in the manufacturing process (for example, the manufacturing process of InP HBT (Heterojunction Bipolar Transistor)) are used as the transistors Q1 and Q2 of the input portion of the peak detector circuit 10, and the transistors Q4 and Q5 of the input portion of the average value detection and output amplitude setting circuit 11.

In this embodiment, however, the load driven by the variable gain amplifier 3 can be reduced to one transistor per output terminal by inserting the buffer circuit 13. That is, when transistors of a minimum size are used as the transistors Q7 and Q8 of the input portion of the buffer circuit 13, the load driven by the variable gain amplifier 3 can be reduced to about ½ as compared to the arrangement without the buffer circuit 13. In this embodiment, since the load, in particular, the capacitive load driven by the variable gain amplifier 3 becomes small, it is possible to ensure a large band on the high frequency side of the variable gain amplifier 3.

The principle by which the output amplitude set in the automatic gain control circuit 5a according to this embodiment is obtained at the output terminal of the variable gain amplifier 3 will be described next using FIG. 1. Let Vpk be the peak value of the output voltage of the variable gain amplifier 3 obtained through the buffer circuit 13, Vav be the average value of the output voltages of the variable gain amplifier 3 obtained through the buffer circuit 13, and Vbe be the base-emitter voltage of the transistors Q1, Q2, Q3, Q4, Q5, and Q6. In this case, the output voltage of the peak detector circuit 10, that is, the voltage of the positive-phase input terminal OT of the high gain amplifier 12 is given by $$Vpk-2Vbe \quad (3)$$

On the other hand, the output voltage of the average value detection and output amplitude setting circuit 11, that is, the voltage of the negative-phase input terminal OC of the high gain amplifier 12 is obtained by adding a voltage (half amplitude) Vset ½ the desired output amplitude of the variable gain amplifier 3 to the average value Vav of the output voltages of the variable gain amplifier 3 and subtracting a value twice the base-emitter voltage Vbe of the transistors Q4, Q5, and Q6 from the sum, as represented by $$Vav+Vset-2Vbe \quad (4)$$

As described above, the high gain amplifier 12 operates to make the output voltage of the peak detector circuit 10 equal to the output voltage of the average value detection and output amplitude setting circuit 11 because (a) the high gain amplifier itself is incorporated in the negative feedback loop formed from the automatic gain control circuit 5a and the variable gain amplifier 3, and (b) the high gain amplifier itself has high gain properties. Hence, $$Vpk-2Vbe=Vav+Vset-2Vbe \quad (5)$$

$$Vpk-Vav=Vset \quad (6)$$

hold.

Equation (6) indicates that the difference between the peak value Vpk and the average value Vav of the output voltages of the variable gain amplifier 3 equals the set value Vset. As for the total amplitude (peak-to-peak amplitude), equation (6) indicates that the total amplitude twice the set value Vset can be obtained by the output of the variable gain amplifier 3. In this way, according to this embodiment, the automatic gain control circuit 5a automatically generates the gain control signal to the variable gain amplifier 3 such that the set output amplitude value is obtained by the output of the variable gain amplifier 3, and the set output amplitude is consequently obtained by the output of the variable gain amplifier 3.

Reduction of the temperature dependence of the output amplitude value of the variable gain amplifier 3 according to this embodiment will be described next using expressions. Letting Vbe1 be the base-emitter voltage of the transistors Q1 and Q2, and Vbe2 be the base-emitter voltage of the transistor Q3, expression (3) can be rewritten as $$Vpk-Vbe1-Vbe2 \quad (7)$$

The voltage of the common node (the common node of the bases of the transistors Q4 and Q5) of the resistors R1, R2, and R3 is given by $$Vav+(VCC-Vav) \times \{(R1 \times R2)/(R1+R2)\}/[\{(R1 \times R2)/(R1+R2)\}+R3] \quad (8)$$

As for the base-emitter voltage of the transistors Q4 and Q5, when three conditions (A) the transistors Q1 and Q2 and the transistors Q4 and Q5 have the same size, (B) the transistor Q3 and the transistor Q6 have the same size, and (C) the current source I1 and the current source I2 have the same current value are met, the base current of the transistor Q3 equals the base current of the transistor Q6, and currents whose magnitudes are ½ the base currents flow to the emitters of the transistors Q1, Q2, Q4, and Q5 having the same size, respectively. For this reason, the base-emitter voltage of the transistors Q4 and Q5 equals the base-emitter voltage Vbe1 of the transistors Q1 and Q2. Note that the transistors having the same size indicate that the same base-emitter voltage is obtained under the same base current. As a method of implementing such transistors, transistors that should have the same size are made to have the same semiconductor layer structure and electrode structure, and the semiconductor layers and the electrodes are formed in the same thickness and length.

As for the base-emitter voltage of the transistor Q6, when the above-described two conditions (B) the transistor Q3 and the transistor Q6 have the same size and (C) the current source I1 and the current source I2 have the same current value are met, the currents of the current sources I1 and I2 having the same current value flow to the emitters of the transistors Q3 and Q6 having the same size, respectively. For this reason, the base-emitter voltage of the transistor Q6 equals the base-emitter voltage Vbe2 of the transistor Q3. Hence, embodiment (4) can specifically be rewritten as $$Vav+(VCC-Vav) \times \{(R1 \times R2)/(R1+R2)\}/[\{(R1 \times R2)/(R1+R2)\}+R3]-Vbe1-Vbe2 \quad (9)$$

From expressions (7) and (9), $$Vpk-Vbe1-Vbe2=Vav+(VCC-Vav) \times \{(R1 \times R2)/(R1+R2)\}/[\{(R1 \times R2)/(R1+R2)\}+R3]-Vbe1-Vbe2 \quad (10)$$

corresponding to expression (5) holds.

Expression (10) can further be rewritten as $$Vpk-Vav=(VCC-Vav) \times \{(R1 \times R2)/(R1+R2)\}/[\{(R1 \times R2)/(R1+R2)\}+R3] \quad (11)$$

That is, in this embodiment, the operation is performed such that the difference between the peak voltage and the average voltage of the variable gain amplifier 3 becomes $(VCC-Vav) \times \{(R1 \times R2)/(R1+R2)\}/\{\{(R1 \times R2)/(R1+R2)\}+R3\}$. Hence, the output amplitude of the variable gain amplifier 3 is given by $$2 \times (VCC-Vav) \times \{(R1 \times R2)/(R1+R2)\}/[\{(R1 \times R2)/(R1+R2)\}+R3] \quad (12)$$

As can be seen from expression (12), the base-emitter voltage Vbe1 of the transistors Q1, Q2, Q4, and Q5 and the base-emitter voltage Vbe2 of the transistors Q3 and Q6 are not included. The reason why the base-emitter voltages Vbe1 and Vbe2 are excluded is as follows. The transistors inserted in the path from the input terminal (the bases of the transistors Q1 and Q2) of the peak detector circuit 10 to the output terminal of the peak detector circuit 10 have a two-stage arrangement including (Q1+Q2) and Q3. The transistors inserted in the path from the input terminal (the one terminal sides of the resistors R1 and R2) of the average value detection and output amplitude setting circuit 11 to the output terminal of the average value detection and output amplitude setting circuit 11 have a two-stage arrangement including (Q4+Q5) and Q6. The number of base-emitter junctions of the transistors inserted in the path from the input terminal to the output terminal of the peak detector circuit 10 equals the number of base-emitter junctions of the transistors inserted in the path from the input terminal to the output terminal of the average value detection and output amplitude setting circuit 11. For this reason, when the high gain amplifier 12 generates the gain control signal from the difference between the output voltage of the peak detector circuit 10 and the output voltage of the average value detection and output amplitude setting circuit 11, the base-emitter voltages Vbe1 and Vbe2 are excluded.

The base-emitter voltages Vbe1 and Vbe2 have a high temperature dependence. If the base-emitter voltages Vbe1 and Vbe2 are included in expression (12), the output amplitude of the variable gain amplifier 3, which should be constant, largely varies. In this embodiment, the base-emitter voltages Vbe1 and Vbe2 having a high temperature dependence are excluded from expression (12) representing the set value of the output amplitude of the variable gain amplifier 3, thereby reducing the temperature dependence.

Note that the resistors R1 to R3 also have a temperature dependence. In expression (12), the expression $\{(R1 \times R2)/(R1-R2)\}/[\{(R1 \times R2)/(R1+R2)\}+R3]$ concerning the resistors R1 to R3 is an expression to calculate a ratio. When the same resistive material is used for the resistors R1 to R3, the individual temperature variations are canceled. For this reason, the temperature dependence of $\{(R1 \times R2)/(R1+R2)\}/[\{(R1 \times R2)/(R1+R2)\}+R3]$ lowers. Hence, in this embodiment, the temperature variation dependence of the output amplitude of the variable gain amplifier 3 can be reduced almost to the temperature dependence of the power supply voltage VCC and the average value Vav of the output voltage of the variable gain amplifier 3.

On the other hand, the output amplitude value of the variable gain amplifier 3 controlled by the automatic gain control circuit 5 shown in FIG. 12 sometimes largely changes depending on the temperature. The automatic gain control circuit 5 shown in FIG. 12 operates by detecting the difference (THo−Ave) between the output voltage THo of the peak detector circuit 50 and the output voltage Ave of the average value detector circuit 51 and comparing the output voltage difference (THo−Ave) with the output voltage Aset of the output amplitude setting circuit 52 so that the difference becomes 0. If the temperature dependence of the output voltage THo of the peak detector circuit 50 and the output voltage Ave of the average value detector circuit 51 are different, temperature dependence is generated in the output voltage difference (THo−Ave). Since the output voltage difference (THo−Ave) that is one of the comparison determination signals used by the automatic gain control circuit 5 to generate the gain control signal has the temperature dependence, temperature dependence is generated in the gain control signal output from the automatic gain control circuit 5 to the variable gain amplifier 3, and as a result, temperature dependence is generated in the output amplitude value of the variable gain amplifier 3 as well. In the conventional automatic gain control circuit 5, temperature dependence may be generated in the output amplitude of the variable gain amplifier 3, as described above. However, according to this embodiment, the temperature dependence can be reduced.

The principle by which the output amplitude of the variable gain amplifier 3 stably varies at the time of a variation in the input amplitude in this embodiment will the described next. To make the output amplitude of the variable gain amplifier 3 stably vary, that is, to make the AGC loop formed from the variable gain amplifier 3 and the automatic gain control circuit 5a stably operate at the time of a variation in the input amplitude, it is necessary to ensure at least 60° or more as the phase margin of the AGC loop. In this embodiment, the resistor Ra and the capacitor C1 are provided in the peak detector circuit 10, thereby decreasing the phase variation amount with respect to the frequency change in the peak detector circuit 10. It is consequently possible to decrease the phase variation amount with respect to the frequency change in the entire AGC loop. Hence, stabilization of the AGC loop can be implemented by ensuring a large phase margin of the AGC loop.

Regarding the base-emitter junction of the transistors Q1 and Q2 as a resistor component R', the arrangement including the transistors Q1 and Q2, the resistor Ra, and the capacitor C1 in the peak detector circuit 10 of this embodiment constitutes a so-called lag lead filter formed from R', Ra, and C1. The lag lead filter is a filter that generates a small phase variation amount with respect to the frequency change while having the transmission characteristic of a low-pass filter that passes a low-frequency component and blocks a high-frequency component. That is, when the resistor Ra is inserted, the peak detector circuit 10 obtains the characteristic of the lag lead filter, and the phase variation amount decreases. This can also suppress the phase variation amount in the entire AGC loop, and as a result, the phase margin of the AGC loop increases. This principle can implement a stable variation in the output amplitude of the variable gain amplifier 3. Note that the cutoff frequency of the lag lead filter need only be equal to or higher than that of the high gain amplifier 12.

Figure 2A:
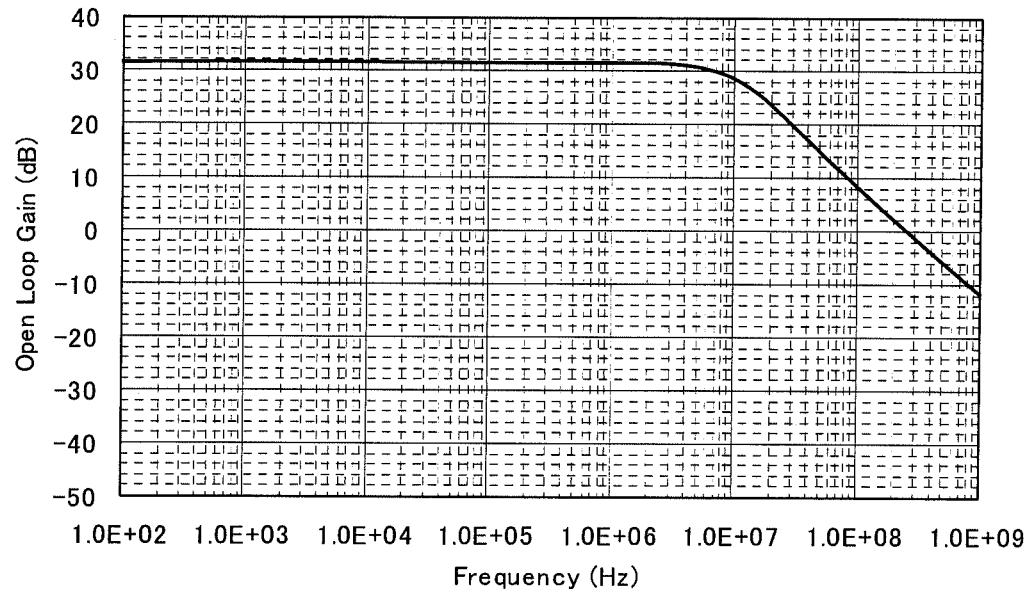
FIG. 2A is a graph showing the frequency characteristic of the gain in the open loop state of an AGC loop according to the first embodiment of the present invention.
Figure 2B:
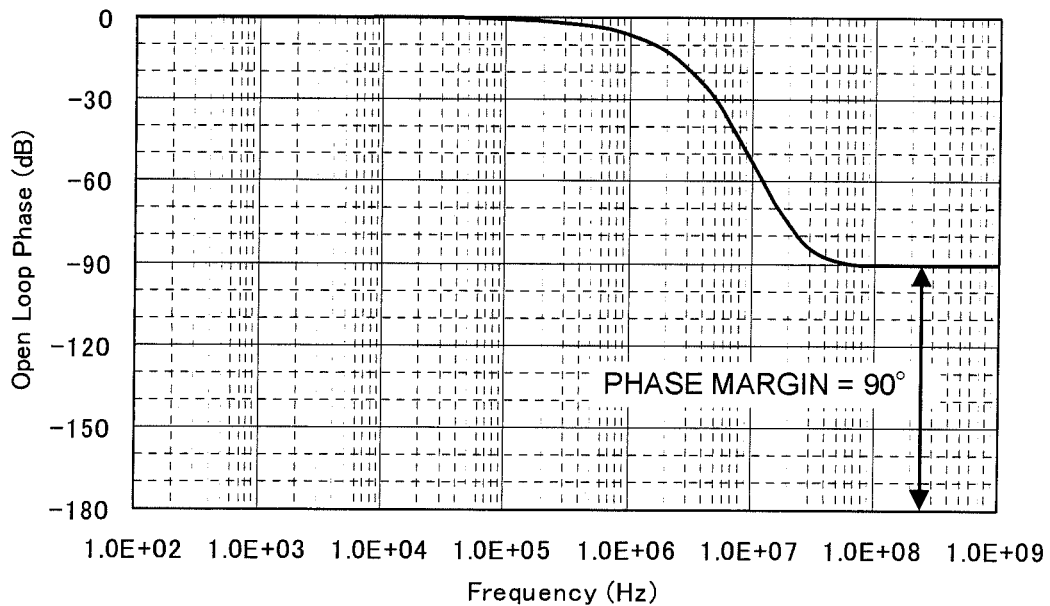
FIG. 2B is a graph showing the frequency characteristic of the phase in the open loop state of the AGC loop according to the first embodiment of the present invention.

FIG. 2A shows the frequency characteristic of the gain in the open loop state of the AGC loop according to this embodiment. FIG. 2B shows the frequency characteristic of the phase. Note that in this embodiment, all transistors are npn InP HBTs (Heterojunction Bipolar Transistors). The resistor Ra is 3 kΩ, and the capacitor C1 is 4 pF. The abscissa of FIG. 2A represents the frequency, and the ordinate represents the gain. The abscissa of FIG. 2B represents the frequency, and the ordinate represents the phase. According to FIG. 2A, the frequency (unity gain frequency) with respect to a gain of 0 dB is 250 MHz. The margin amount up to a phase of 180° at the unity gain frequency of 250 MHz, that is, the phase margin is 90° according to FIG. 2B. As is apparent, a phase margin much larger than the phase margin of 60° necessary for the stable operation of the AGC loop can be ensured.

Figure 3:
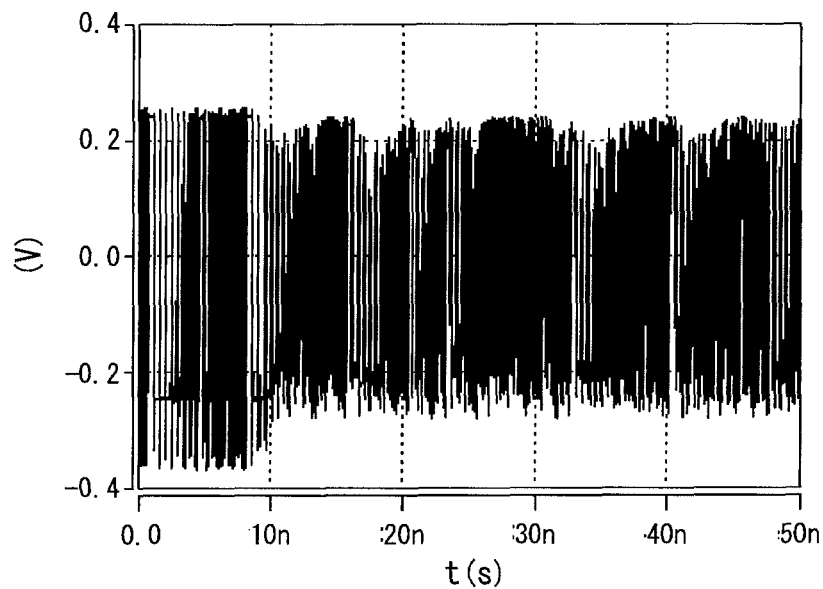
FIG. 3 is a graph showing a result obtained by simulating a variation in the output waveform of a variable gain amplifier according to the first embodiment of the present invention.

FIG. 3 shows a result obtained by simulating a variation in the output waveform of the variable gain amplifier 3 according to this embodiment. The abscissa of FIG. 3 represents the time, and the ordinate represents the voltage. FIG. 3 shows a simulation result obtained by starting inputting a pseudo random bit sequence (PRBS) having an amplitude of 50 mVpp, a bit rate of 32 Gbps, and a bit length of $2^{15}-1$ to the variable gain amplifier 3 from 0 s. Note that no input signal exists before 0 s. In the example shown in FIG. 3, a signal having an output amplitude of about 600 mVpp is output from the variable gain amplifier 3 from 0 s to a point before 10 ns. After that, the output amplitude of the variable gain amplifier 3 stably transits to near the set amplitude of 500 mVpp without repeating the increase and decrease in the amplitude, as can be seen. As is apparent, the arrangement of this embodiment can stabilize the AGC loop and also consequently make the output amplitude stably vary at the time of the variation in the input to the variable gain amplifier 3.

Figure 4:
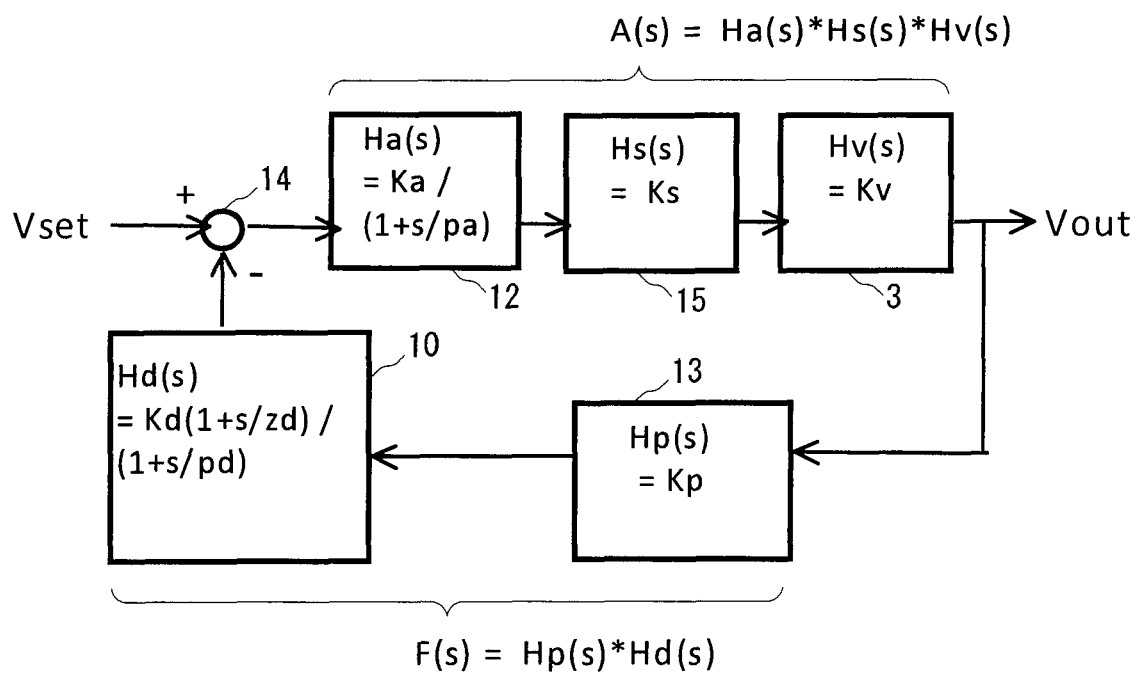
FIG. 4 is a circuit diagram showing an AGC loop model according to the first embodiment of the present invention.

FIG. 4 shows an AGC loop model according to this embodiment. The same reference numerals as in FIG. 1 denote constituent elements corresponding to those in FIG. 1. An element 14 shown in FIG. 4 corresponds to, out of the internal circuits of the high gain amplifier 12, a functional portion that obtains the difference between the output voltage of the peak detector circuit 10 and the output voltage of the average value detection and output amplitude setting circuit 11. An element 15 corresponds to a selector circuit (not illustrated in FIG. 1) that is inserted between the high gain amplifier 12 and the variable gain amplifier 3 to select the gain control signal. This selector circuit can select, as the gain control signal, a signal generated by the automatic gain control circuit 5a or an externally given signal. FIG. 1 corresponds to a state in which the signal generated by the automatic gain control circuit 5a is selected as the gain control signal. Vset is the output of the average value detection and output amplitude setting circuit 11. Let Kv be a transfer function Hv(s) of the variable gain amplifier 3, Kd{1+s/(zd)}/{1+s/(pd)} be a transfer function Hd(s) of the peak detector circuit 10, Ka/{1+s/(pa)} be a transfer function Ha(s) of the high gain amplifier 12, Kp be a transfer function Hp(s) of the buffer circuit 13, and Ks be a transfer function Hs(s) of the element 15. At this time, a transfer function O(s) of the open loop of the AGC loop shown in FIG. 4 is given by

[Mathematical 1]

$$O(s) = A(s) \cdot F(s) = \frac{Ka \cdot Ks \cdot Kv \cdot Kp \cdot Kd\left(1 + \frac{s}{zd}\right)}{\left(1 + \frac{s}{pa}\right)\left(1 + \frac{s}{pd}\right)} \quad (13)$$

The characteristics shown in FIGS. 2A and 2B are obtained by simulations based on the transfer function O(s) represented by equation (13).

Figure 5A:
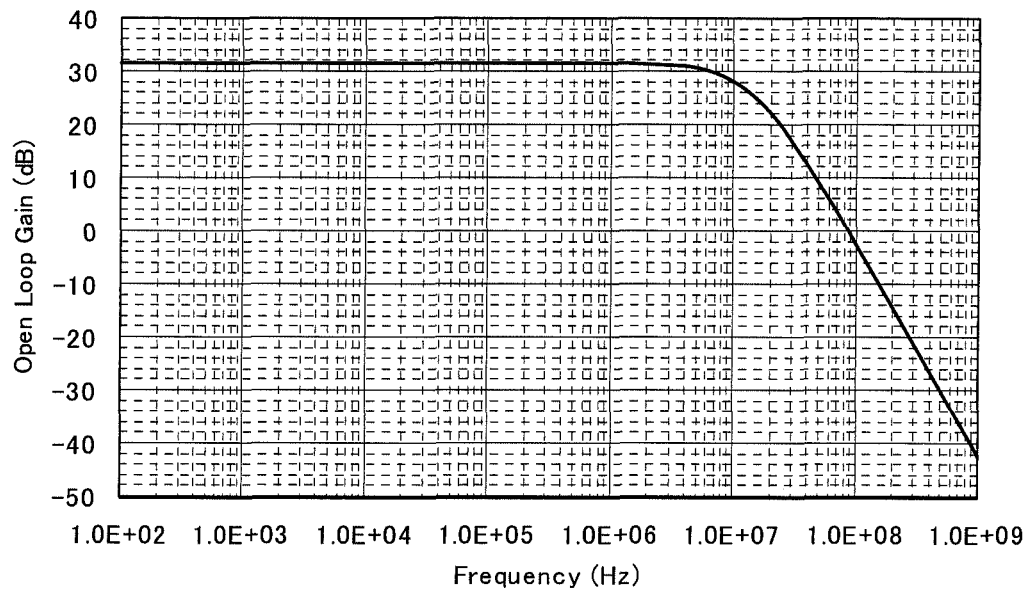
FIG. 5A is a graph showing the frequency characteristic of the gain in the open loop state of the AGC loop when the peak detector circuit is provided with only a capacitor.
Figure 5B:
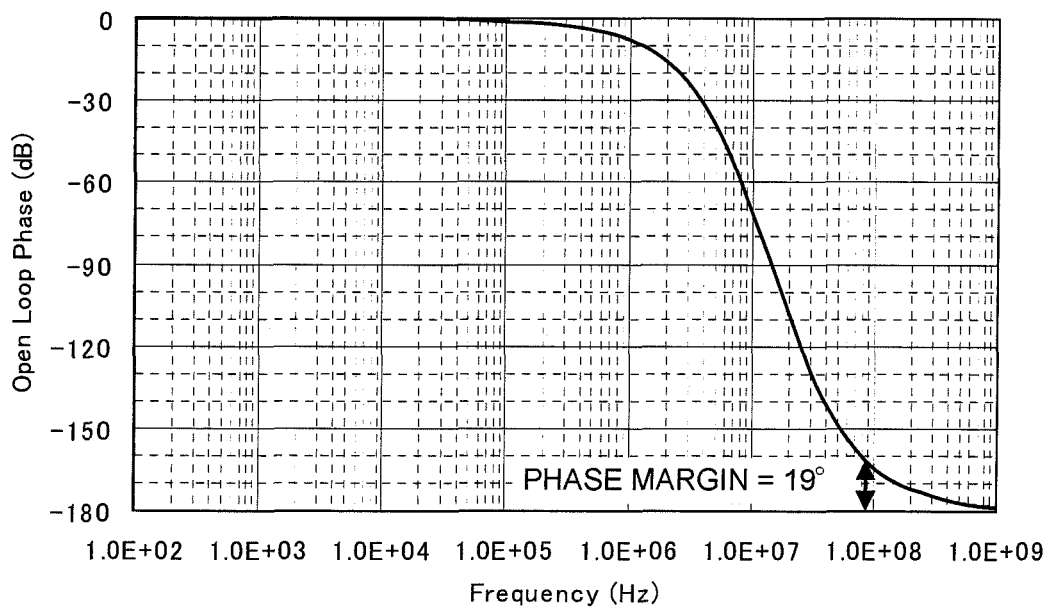
FIG. 5B is a graph showing the frequency characteristic of the phase in the open loop state of the AGC loop when the peak detector circuit is provided with only a capacitor.

For the sake of comparison with this embodiment, FIG. 5A shows the frequency characteristic of the gain in the open loop state of the AGC loop when the resistor Ra is short-circuited, that is, only the capacitor C1 is provided between the power supply voltage VEE and the emitters of the transistors Q1 and Q2, and FIG. 5B shows the frequency characteristic of the phase in this case. According to FIG. 5A, the frequency (unity gain frequency) with respect to a gain of 0 dB is 86 MHz. The margin amount up to a phase of 180° at the unity gain frequency of 86 MHz, that is, the phase margin is 19° according to FIG. 5B. As is apparent, when the peak detector circuit is provided only the capacitor C1, the phase margin of 60° necessary for the stable operation of the AGC loop cannot be ensured. The reason why the phase margin cannot be ensured when the peak detector circuit is provided only the capacitor C1 is as follows. The impedance of the capacitor C1 is expressed as 1/jωC1 (j is imaginary unit, and ω is the angular frequency), and has a characteristic to increase the phase variation amount as the frequency rises. The phase variation of the capacitor C1 appears in the phase-frequency characteristic of the AGC loop.

Figure 6:
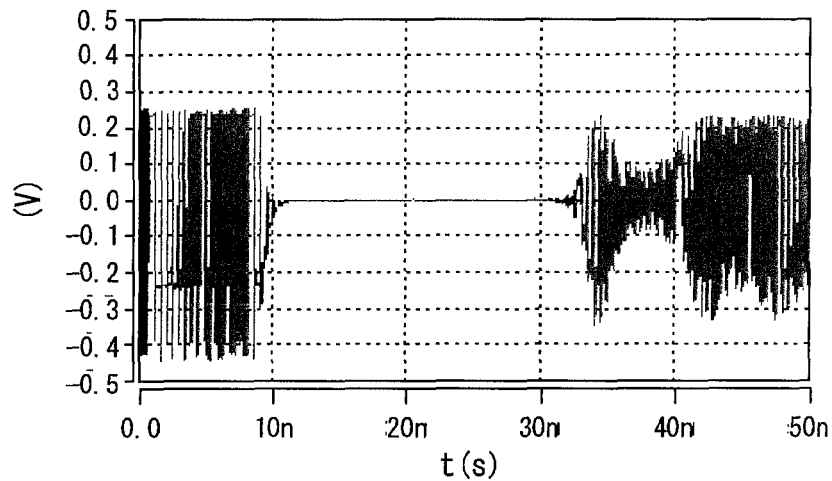
FIG. 6 is a graph showing a result obtained by simulating a variation in the output waveform of the variable gain amplifier when the peak detector circuit is provided with only a capacitor.

FIG. 6 shows a result obtained by simulating a variation in the output waveform of the variable gain amplifier 3 when only the capacitor C1 is provided between the power supply voltage VEE and the emitters of the transistors Q1 and Q2. FIG. 6 shows a simulation result obtained under the completely same conditions as those of the simulation shown in FIG. 3, that is, by starting inputting a pseudo random bit sequence having an amplitude of 50 mVpp, a bit rate of 32 Gbps, and a bit length of $2^{15}-1$ to the variable gain amplifier 3 from 0 s. In the example shown in FIG. 6, a signal having an output amplitude of about 600 mVpp is output from the variable gain amplifier 3 from 0 s to almost 10 ns. After that, a state in which the output amplitude is 0 continues from 10 ns to almost 30 ns. After 30 ns, the output amplitude of the variable gain amplifier 3 temporarily increases to about 500 mVpp. The output amplitude decreases to about 200 mVpp again near 35 ns. Only after 40 ns, the output amplitude converges to near the set amplitude of 500 mVpp. As described above, when the peak detector circuit is provided with only the capacitor C1, the output amplitude of the variable gain amplifier 3 varies while repeating the increase and decrease, that is, unstably varies up to the set amplitude.

Additionally, in this embodiment, it is also possible to obtain another effect of shortening the response time until the output amplitude of the variable gain amplifier 3 reaches the set amplitude. When the peak detector circuit is provided with only the capacitor C1, the output amplitude of the variable gain amplifier 3 is unstable and repeats the increase and decrease, as shown in FIG. 6. For this reason, a time of 40 ns or more is required until the output amplitude converges to the set amplitude of 500 mVpp. To the contrary, in this embodiment, the time required until the output amplitude of the variable gain amplifier 3 converges to the set amplitude of 500 mVpp is about 10 ns, as shown in FIG. 3.

Figure 7:
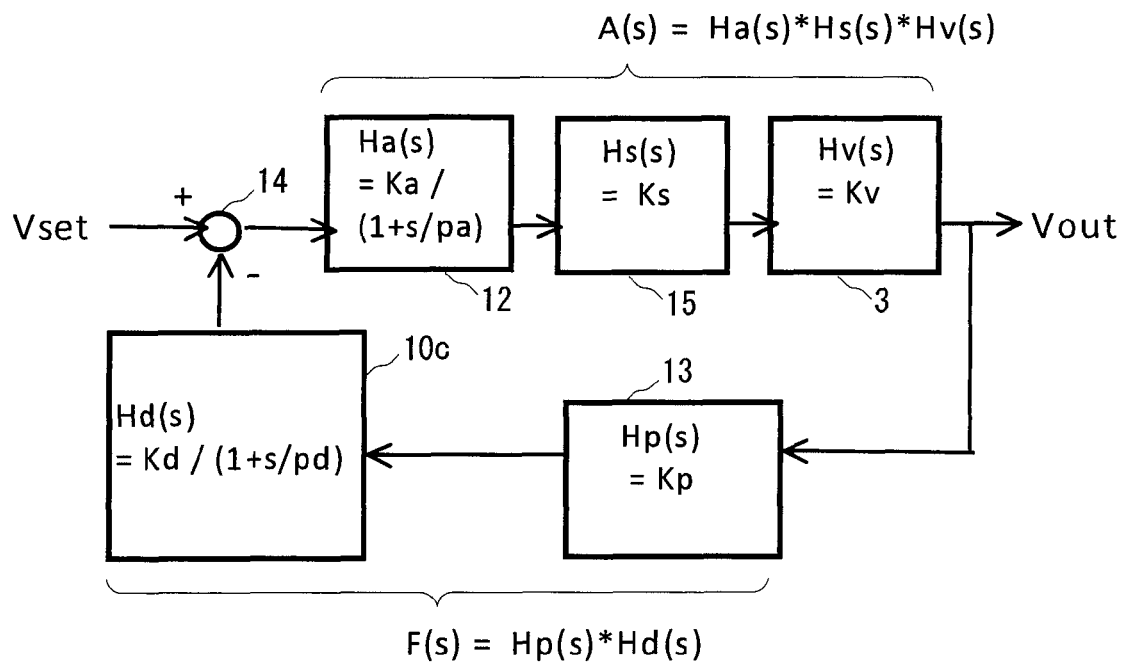
FIG. 7 is a circuit diagram showing an AGC loop model when the peak detector circuit is provided with only a capacitor.

FIG. 7 shows an AGC loop model when only the capacitor C1 is provided between the power supply voltage VEE and the emitters of the transistors Q1 and Q2. An element 10c shown in FIG. 7 corresponds to a circuit in which only the capacitor C1 is provided between the power supply voltage VEE and the emitters of the transistors Q1 and Q2 of the peak detector circuit 10 shown in FIG. 1. Let Kd/{1+s/(pd)} be the transfer function Hd(s) of the element 10c. The transfer function O(s) of the open loop of the AGC loop shown in FIG. 7 is given by

[Mathematical 2]

$$O(s) = A(s) \cdot F(s) = \frac{Ka \cdot Ks \cdot Kv \cdot Kp \cdot Kd}{\left(1 + \frac{s}{pa}\right)\left(1 + \frac{s}{pd}\right)} \quad (14)$$

The characteristics shown in FIGS. 5A and 5B are obtained by simulations based on the transfer function O(s) represented by equation (14).

Second Embodiment

Figure 8:
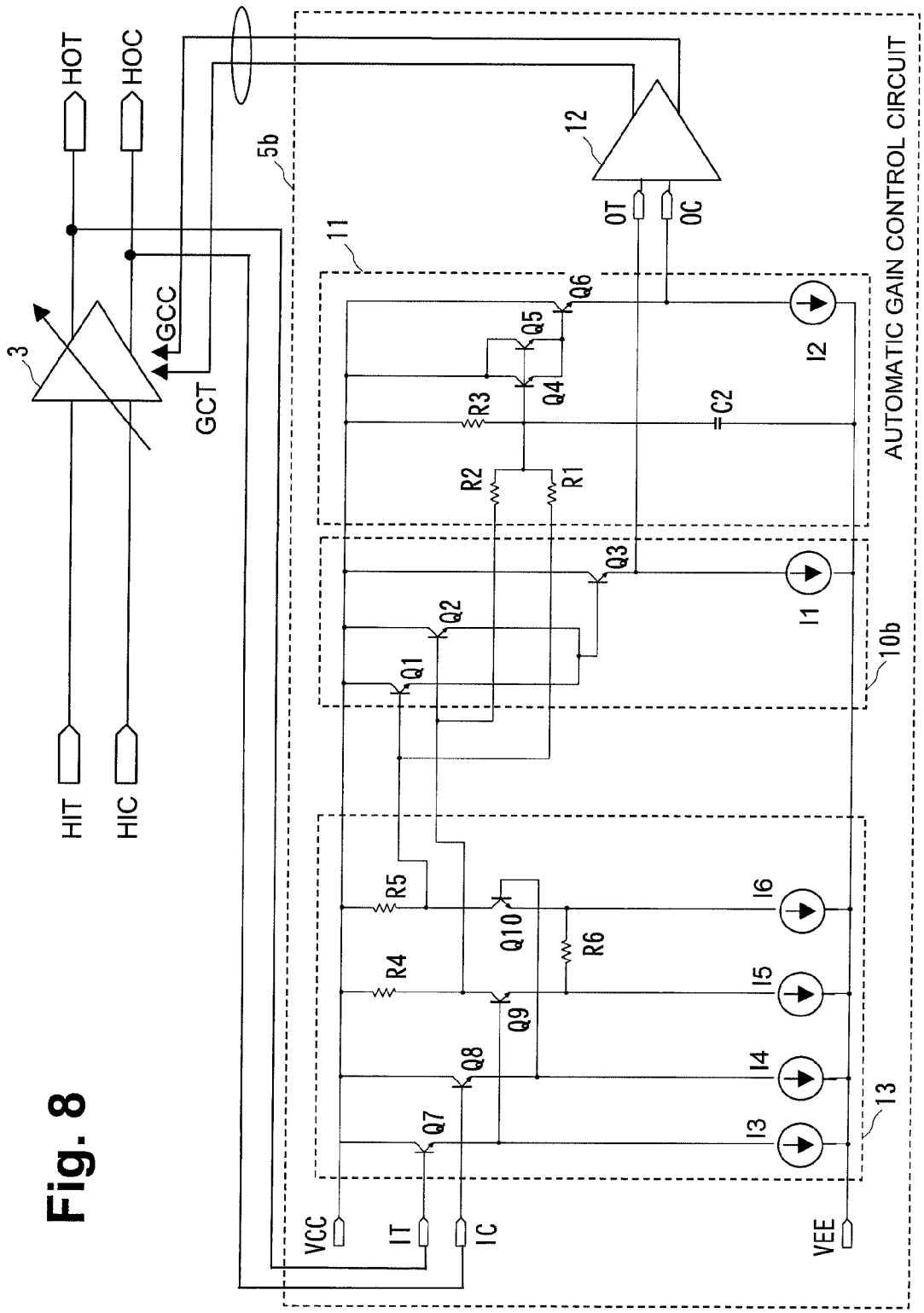
FIG. 8 is a circuit diagram showing the arrangement of an automatic gain control circuit according to the second embodiment of the present invention.

The second embodiment of the present invention will be described next. FIG. 8 is a circuit diagram showing the arrangement of an automatic gain control circuit according to the second embodiment of the present invention. The same reference numerals as in FIG. 1 denote the same components in FIG. 8.

An automatic gain control circuit 5b according to this embodiment includes a peak detector circuit 10b, an average value detection and output amplitude setting circuit 11, a high gain amplifier 12, and a buffer circuit 13.

In the first embodiment, the resistor Ra is provided in series with the capacitor C1 in the peak detector circuit 10, thereby reducing the influence of the capacitor C1 and making the phase variation amount small. However, the peak detector circuit 10b of the second embodiment corresponds to an arrangement obtained by removing the resistor Ra and the capacitor C1 from the peak detector circuit 10 of the first embodiment and making the resistor of the lag lead filter of the first embodiment infinite, that is, an arrangement using one limit solution of the lag lead filter. When the resistor Ra and the capacitor C1 are removed, the phase variation amount with respect to the frequency change in the peak detector circuit 10b can be decreased. It is consequently possible to decrease the phase variation amount with respect to the frequency change in the entire AGC loop. Hence, stabilization of the AGC loop can be implemented by ensuring a large phase margin of the AGC loop.

Note that the capacitor C1 of the peak detector circuit is involved in both the role of holding the peak value of the output signal of a variable gain amplifier 3 and the role of setting the period to detect the peak value. The magnitude of the capacitor C1 particularly strongly influences the period to detect the peak value. The signal to be handled is restricted here to a high-frequency signal. As for holding of the peak value, the necessary capacitor can be ensured only by the parasitic capacitor of a transistor Q3. On the other hand, as for the period of detect the peak value, when the capacitor C1 is removed from the peak detector circuit, the frequency with which the output from the peak detector circuit is updated rises. However, the operation is possible only by the parasitic capacitance of the transistor Q3, and no abnormal operation such as oscillation occurs. That is, if the signal to be handled is a high-frequency signal, the operation of the variable gain amplifier 3 can be implemented only by the parasitic capacitance of the transistor Q3 even when the influence of the capacitor C1 is reduced as in the first embodiment, or the capacitor C1 is removed as in this embodiment.

Figure 9A:
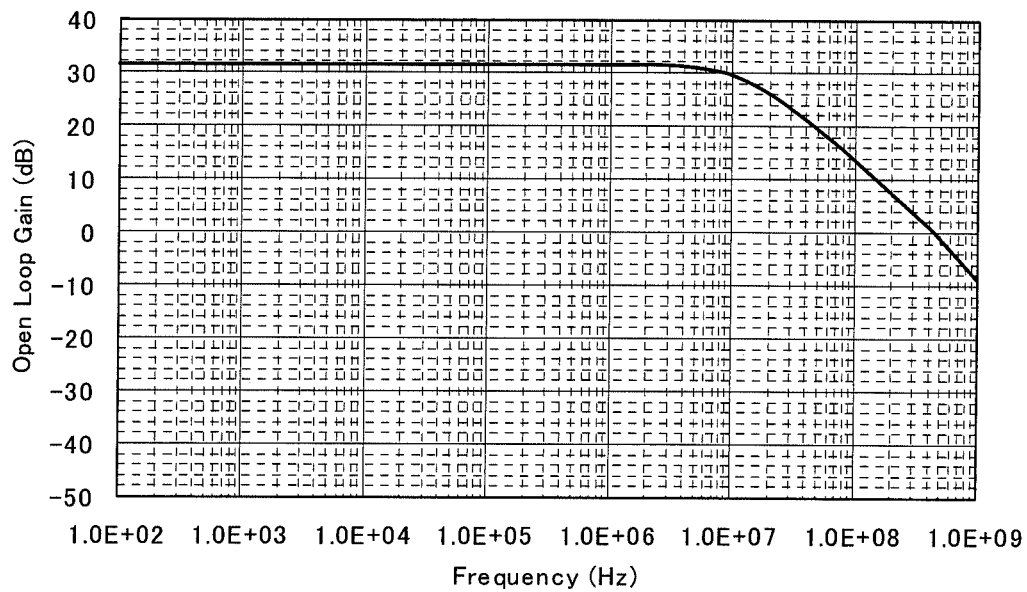
FIG. 9A is a graph showing the frequency characteristic of the gain in the open loop state of an AGC loop according to the second embodiment of the present invention.
Figure 9B:
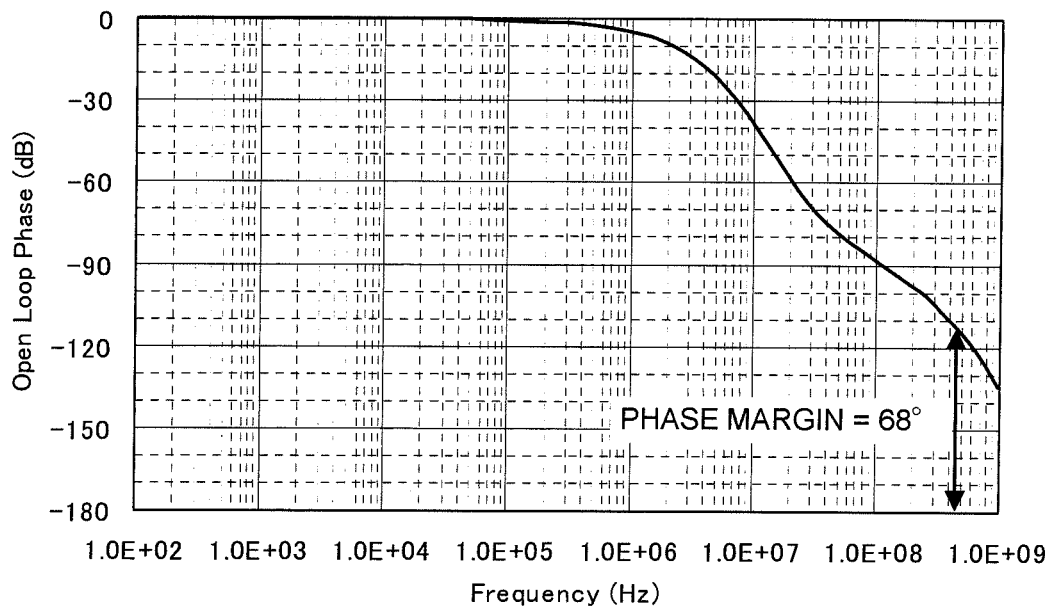
FIG. 9B is a graph showing the frequency characteristic of the phase in the open loop state of the AGC loop according to the second embodiment of the present invention.

FIG. 9A shows the frequency characteristic of the gain in the open loop state of the AGC loop according to this embodiment. FIG. 9B shows the frequency characteristic of the phase. In this embodiment, all transistors are npn InP HBTs (Heterojunction Bipolar Transistors), as in the first embodiment. According to FIG. 9A, the frequency (unity gain frequency) with respect to a gain of 0 dB is 440 MHz. The margin amount up to a phase of 180° at the unity gain frequency of 440 MHz, that is, the phase margin is 68° according to FIG. 9B. As is apparent, a phase margin larger than the value of 60° necessary for the stable operation of the AGC loop can be ensured.

Figure 10:
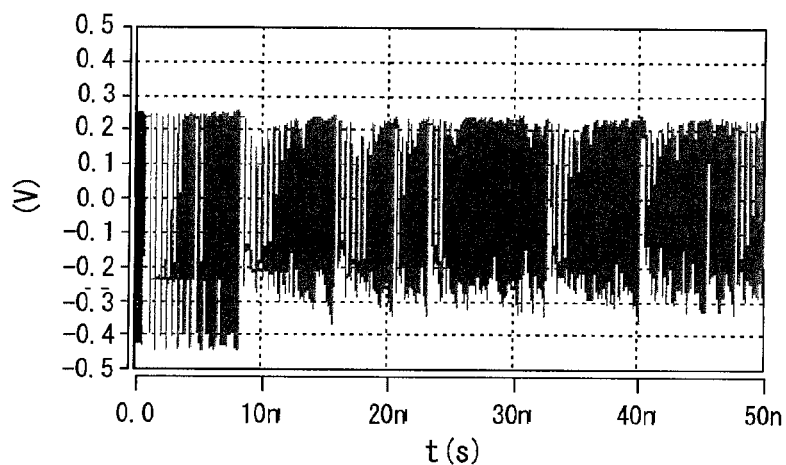
FIG. 10 is a graph showing a result obtained by simulating a variation in the output waveform of a variable gain amplifier according to the second embodiment of the present invention.

FIG. 10 shows a result obtained by simulating a variation in the output waveform of the variable gain amplifier 3 according to this embodiment. FIG. 10 shows a simulation result obtained under the completely same conditions as those of the simulation shown in FIG. 3, that is, by starting inputting a pseudo random bit sequence having an amplitude of 50 mVpp, a bit rate of 32 Gbps, and a bit length of $2^{15}-1$ to the variable gain amplifier 3 from 0 s. In the example shown in FIG. 10, a signal having an output amplitude of about 600 mVpp is output from the variable gain amplifier 3 from 0 s to a point before 10 ns. After that, the output amplitude of the variable gain amplifier 3 stably transits to near the set amplitude of 500 mVpp without repeating the increase and decrease in the amplitude, as can be seen. As is apparent, the arrangement of this embodiment can stabilize the AGC loop and also consequently make the output amplitude stably vary at the time of the variation in the input to the variable gain amplifier 3.

Additionally, in this embodiment, it is also possible to obtain another effect of shortening the response time until the output amplitude of the variable gain amplifier 3 reaches the set amplitude, as in the first embodiment. When the peak detector circuit is provided with only the capacitor C1, the output amplitude of the variable gain amplifier 3 is unstable and repeats the increase and decrease, as shown in FIG. 6. For this reason, a time of 40 ns or more is required until the output amplitude converges to the set amplitude of 500 mVpp. To the contrary, in this embodiment, the time required until the output amplitude of the variable gain amplifier 3 converges to the set amplitude of 500 mVpp is about 10 ns, as shown in FIG. 10.

Figure 11:
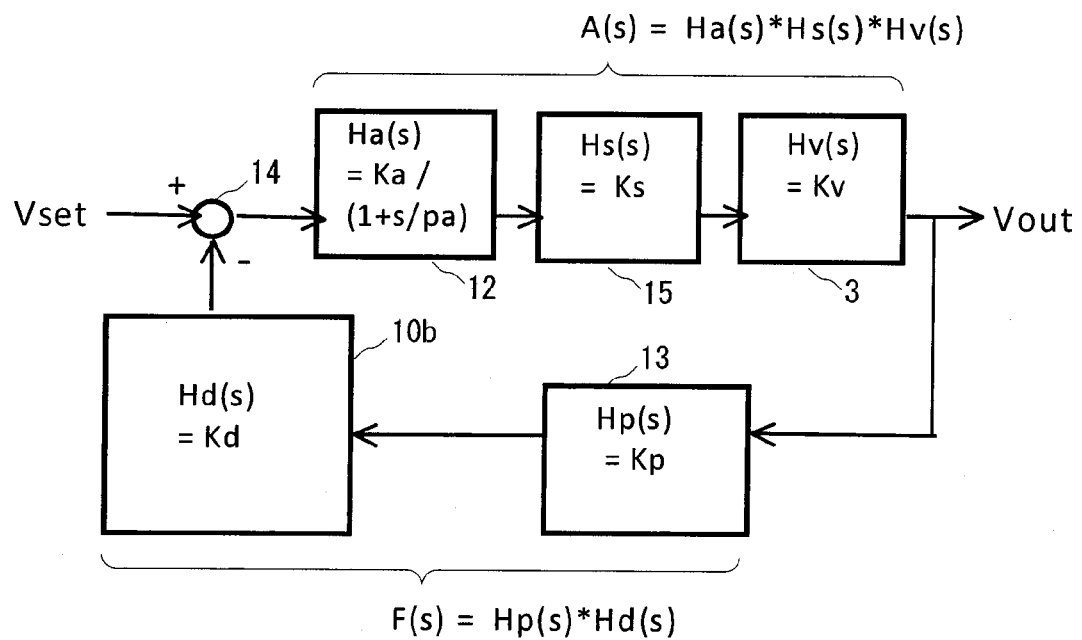
FIG. 11 is a circuit diagram showing an AGC loop model according to the second embodiment of the present invention.

FIG. 11 shows an AGC loop model according to this embodiment. The same reference numerals as in FIGS. 4 and 8 denote constituent elements corresponding to those in FIGS. 4 and 8. Let Kd be a transfer function Hd(s) of the peak detector circuit 10b. A transfer function O(s) of the open loop of the AGC loop shown in FIG. 11 is given by

[Mathematical 3]

$$O(s) = A(s) \cdot F(s) = \frac{Ka \cdot Ks \cdot Kv \cdot Kp \cdot Kd}{\left(1 + \frac{s}{pa}\right)} \quad (15)$$

The characteristics shown in FIGS. 9A and 9B are obtained by simulations based on the transfer function O(s) represented by equation (15).

Note that in the first and second embodiments, the arrangement of a Gilbert cell type variable gain amplifier sown in FIG. 13 has been exemplified as the arrangement of the variable gain amplifier 3. However, the present invention is not limited to this, and is applicable to another variable gain amplifier.

Additionally, in the first and second embodiments, the buffer circuit 13 is provided between the peak detector circuit 10 or 10b and the positive-phase input terminal IT and the negative-phase input terminal IC of the automatic gain control circuit 5a or 5b. However, the buffer circuit 13 is not an indispensable constituent element. That is, the positive-phase input terminal and the negative-phase input terminal of the automatic gain control circuit 5a or 5b may directly be connected to the positive-phase input terminal and the negative-phase input terminal of the peak detector circuit 10 or 10b.

INDUSTRIAL APPLICABILITY

The present invention is applicable to a technique of adjusting the gain of a variable gain amplifier.

EXPLANATION OF THE REFERENCE NUMERALS AND SIGNS

3 . . . variable gain amplifier, 5a, 5b . . . automatic gain control circuit, 10, 10b . . . peak detector circuit, 11 . . . average value detection and output amplitude setting circuit, 12 . . . high gain amplifier, 13 . . . buffer circuit, Q1 to Q10 . . . transistor, R1 to R6, Ra . . . resistor, C1, C2 . . . capacitor, I1 to I6 . . . current source

The invention claimed is:

1. An automatic gain control circuit that controls a gain of a variable gain amplifier that amplifies a main signal, comprising:
   a peak detector circuit that detects a peak voltage of an output signal from said variable gain amplifier;
   an average value detection and output amplitude setting circuit that detects an average voltage of the output signals from said variable gain amplifier and adds a voltage ½ a desired output amplitude of said variable gain amplifier to the average voltage; and
   an amplifier circuit that amplifies a difference between an output voltage of said peak detector circuit and an output voltage of said average value detection and output amplitude setting circuit and controls the gain of said variable gain amplifier using an amplification result as a gain control signal,
   said peak detector circuit comprising:
   a first transistor having a base connected to a positive-phase input terminal of the automatic gain control circuit and a collector receiving a power supply voltage;
   a second transistor having a base connected to a negative-phase input terminal of the automatic gain control circuit and a collector receiving the power supply voltage; and
   a first emitter follower circuit having an input connected to emitters of said first transistor and said second transistor and an output connected to an output terminal of said peak detector circuit.

2. An automatic gain control circuit according to claim 1, wherein said peak detector circuit further comprises a filter circuit having one terminal connected to the emitters of said first transistor and said second transistor, and the other terminal grounded,
   said filter circuit comprising a series connection of a filter resistor and a filter capacitor.

3. An automatic gain control circuit according to claim 1, wherein said average value detection and output amplitude setting circuit comprises:
   a voltage detection and setting circuit that adds the voltage ½ the desired output amplitude of said variable gain amplifier to an average voltage between a voltage of the positive-phase input terminal and the voltage of the negative-phase input terminal;
   a third transistor and a fourth transistor each having a base connected to an output terminal of said voltage detection and setting circuit and a collector receiving the power supply voltage;
   a second emitter follower circuit having an input connected to emitters of said third transistor and said fourth transistor and an output connected to the output terminal of said average value detection and output amplitude setting circuit; and
   a capacitor having one terminal connected to the output terminal of said voltage detection and setting circuit and the bases of said third transistor and said fourth transistor and the other terminal grounded,
   said voltage detection and setting circuit comprising:
   a first resistor having one terminal connected to the positive-phase input terminal and the other terminal connected to the output terminal of said voltage detection and setting circuit;
   a second resistor having one terminal connected to the negative-phase input terminal and the other terminal connected to the output terminal of said voltage detection and setting circuit; and
   a third resistor having one terminal connected to the power supply voltage and the other terminal connected to the output terminal of said voltage detection and setting circuit.

* * * * *